(12) United States Patent
Johnson

(10) Patent No.: US 7,064,976 B2
(45) Date of Patent: Jun. 20, 2006

(54) METHOD OF OPERATING A STACKED SPIN BASED MEMORY

(75) Inventor: Mark B. Johnson, Potomac, MD (US)

(73) Assignee: Spin Op Corporation, Los Altos, CA (US)

( * ) Notice: Subject to any disclaimer, the term of this patent is extended or adjusted under 35 U.S.C. 154(b) by 0 days.

(21) Appl. No.: 11/086,603

(22) Filed: Mar. 21, 2005

(65) Prior Publication Data

US 2005/0162903 A1    Jul. 28, 2005

Related U.S. Application Data

(60) Continuation of application No. 10/776,144, filed on Feb. 10, 2004, now Pat. No. 6,870,761, which is a continuation of application No. 10/100,210, filed on Mar. 18, 2002, now Pat. No. 6,741,494, which is a continuation of application No. 09/532,706, filed on Mar. 22, 2000, now Pat. No. 6,388,916, which is a division of application No. 08/806,028, filed on Feb. 24, 1997, now Pat. No. 6,064,083, which is a continuation-in-part of application No. 08/643,805, filed on May 6, 1996, now Pat. No. 5,652,445, which is a continuation-in-part of application No. 08/493,815, filed on Jun. 22, 1995, now Pat. No. 5,565,695, said application No. 08/806,028 is a continuation-in-part of application No. 08/425,884, filed on Apr. 21, 1995, now Pat. No. 5,629,549, and a continuation-in-part of application No. 08/643,804, filed on May 6, 1996, now Pat. No. 5,654,566.

(51) Int. Cl.
*G11C 11/00* (2006.01)

(52) U.S. Cl. .................... 365/158; 365/170; 365/173

(58) Field of Classification Search ................ 365/158, 365/170, 171, 173
See application file for complete search history.

(56) References Cited

U.S. PATENT DOCUMENTS

| | | | |
|---|---|---|---|
| 3,650,581 A | 3/1972 | Boden et al. |
| 4,314,349 A | 2/1982 | Batcher |
| 4,360,899 A | 11/1982 | Dimyan et al. |
| 4,607,271 A | 8/1986 | Popovic et al. |
| 4,663,607 A | 5/1987 | Kitada et al. |
| 4,700,211 A | 10/1987 | Popovic et al. |
| 4,780,848 A | 10/1988 | Daughton et al. |
| 4,896,296 A | 1/1990 | Turner et al. |
| 4,905,178 A | 2/1990 | Mor et al. |
| 5,089,991 A | 2/1992 | Matthews |
| 5,173,873 A | 12/1992 | Wu et al. |
| 5,237,529 A | 8/1993 | Spitzer |
| 5,239,504 A | 8/1993 | Brady et al. |
| 5,245,226 A | 9/1993 | Hood et al. |
| 5,245,227 A | 9/1993 | Furtek et al. |
| 5,251,170 A | 10/1993 | Daughton et al. |

(Continued)

OTHER PUBLICATIONS

R. Meservey, P. M. Tedrow and P. Fulde, Phys. Rev. Lett. 25, 1270 (1970).

(Continued)

*Primary Examiner*—Gene N. Auduong
(74) *Attorney, Agent, or Firm*—J. Nicholas Gross

(57) ABSTRACT

A method of operating a spin based memory cell stacked architecture is provided. The cells are comprised of magnetic spin storage elements stacked on top of each other on a silicon substrate, as well as one or two semiconductor FET isolation elements.

20 Claims, 8 Drawing Sheets

U.S. PATENT DOCUMENTS

| | | | |
|---|---|---|---|
| 5,289,410 | A | 2/1994 | Katti et al. |
| 5,329,480 | A | 7/1994 | Wu et al. |
| 5,329,846 | A | 7/1994 | Bonutti |
| 5,396,455 | A | 3/1995 | Brady et al. |
| 5,420,819 | A | 5/1995 | Pohm |
| 5,424,236 | A | 6/1995 | Daughton et al. |
| 5,432,373 | A | 7/1995 | Johnson |
| 5,448,515 | A | 9/1995 | Fukami et al. |
| 5,452,163 | A | 9/1995 | Coffey et al. |
| 5,475,277 | A | 12/1995 | Johnson |
| 5,488,250 | A | 1/1996 | Hennig |
| 5,491,338 | A | 2/1996 | Spitzer |
| 5,580,814 | A | 12/1996 | Larson |
| 5,594,366 | A | 1/1997 | Khong et al. |
| 5,608,593 | A | 3/1997 | Kim et al. |
| 5,621,338 | A | 4/1997 | Liu et al. |
| 5,629,922 | A | 5/1997 | Moodera et al. |
| 5,640,343 | A | 6/1997 | Gallagher et al. |
| 5,652,875 | A | 7/1997 | Taylor |
| 5,998,040 | A | 12/1999 | Nakatani et al. |
| 6,064,083 | A | 5/2000 | Johnson |
| 6,205,008 | B1 | 3/2001 | Gijs et al. |
| 6,342,713 | B1 | 1/2002 | Johnson |
| 6,381,170 | B1 | 4/2002 | Prinz |
| 6,388,916 | B1 | 5/2002 | Johnson |
| 6,870,761 | B1 * | 3/2005 | Johnson ...................... 365/158 |
| 2004/0130936 | A1 * | 7/2004 | Nguyen et al. ............. 365/158 |

OTHER PUBLICATIONS

P.M. Tedrow and R. Meservey, Phys. Rev. Lett. 26, 192 (1971).

P.M. Tedrow and R. Meservey, Phys. Rev. B 7, 318 (1973). (9 pages).

Paul Horowitz and Winfield Hill, *The Art of Electronics*, Cambridge Univ. Press, Cambridge U.K. (1980); see p. 328.

Mark Johnson and R. H. Silsbee, *Interfacial Charge-Spin Coupling; Injection and Detection of Spin Magnetization in Metals*, Phys. Rev. Lett. 55, 1790 (1985). (4 pages).

Mark Johnson and R. H. Silsbee, *A Thermodynamic Analysis of Interfacial Transport and of the Thermomagnetoelectric System*, Phys. Rev. B 35, 4959 (1987). (14 pages).

P. C. van Son, H. van Kampen and P. Wyder, Phys. Rev. Lett. 58, 2271 (1987). (3 pages).

Mark Johnson and R. H. Silsbee, *Ferromagnet-Nonferromagnet Interface Resistance*, Phys. Rev. Lett. 60, 377 (1988).

Mark Johnson and R. H. Silsbee, *Coupling of Electronic Charge and Spin at a Ferro-magnetic-Paramagnetic Interface*, Phys. Rev. B 37, 5312 (1988). (14 pages).

Mark Johnson and R. H. Silsbee, *The Spin Injection Experiment*, Phys. Rev. B 37, 5326 (1988). (10 pages).

Mark Johnson and H. Silsbee, *Electron Spin Injection and Detection at a Ferromagnetic-Paramagnetic Interface*, J. Appl. Phys. 63, 3934 (1988). (6 pages).

P. C. van Son, H. van Kampen and P. Wyder, Phys. Rev. Lett. 60, 378 (1988).

R.S. Popovic, *Hall-effect Devices*, Sens. Actuators 17, 39 (1989).

James Daughton, *Magnetoresistive Memory Technology*, Thin Solid Films 216, 162 (1992). (7 pages).

J. De Boeck, J. Harbison et al., *Non-volatile Memory Characteristics of Submicrometer Hall Structures Fabricated in Epitaxial Ferromagnetic MnAl Films on GaAs*, Electronics Letters 29, 421 (1993). (3 pages).

Mark Johnson, *Spin Accumulation in Gold Films*, Phys. Rev. Lett. 70, 2142 (1993). (4 pages).

Mark Johnson, *Bipolar Spin Switch*, Science 260, 320 (1993). (4 pages).

Mark Johnson, *Bilayer Embodiment of the Bipolar Spin Switch*, Appl. Phys. Lett. 63, 1435 (1993). (3 pages).

Mark Johnson, *The All-Metal Spin Transistor*, I.E.E.E. Spectrum Magazine 31 No. 5, 47 (1994). (5 pages).

Mark Johnson, *Spin Polarization of Gold Films via Transport*, J. Appl. Phys. 75, 6714 (1994). (6 pages).

Mark Johnson, *Spin-Coupled Resistance Observed in Ferromagnet-Superconductor—Ferromagnet Trilayers*, Appl. Lett., Sep. 12, 1994.

Mark Johnson, *The Bipolar Spin Transistor*, I.E.E.E. Potentials 14, 26 (1995).

S. T. Chui and J. R. Cullen, *Spin Transmission in Metallic Trilayers*, Phys. Rev. Lett. 74, 2118 (1995). (4 pages).

* cited by examiner

METHOD OF OPERATING A STACKED SPIN BASED MEMORY

RELATED APPLICATION DATA

The present invention claims priority to and is a continuation of application Ser. No. 10/776,144 filed Feb. 10, 2004 now U.S. Pat. No. 6,870,761, which in turn is a continuation of and claims priority to Ser. No. 10/100,210 filed Mar. 18, 2002 now U.S. Pat. No. 6,741,494 entitled "Magnetoelectronic Memory Element With Inductively Coupled Write Wires." Application Ser. No. 10/100,210 is a continuation of an application Ser. No. 09/532,706 filed Mar. 22, 2000 titled "Magnetoelectronic Memory Element With Isolation Element" (now U.S. Pat. No. 6,388,916). The latter application Ser. No. 09/532,706 is in turn a divisional application of Ser. No. 08/806,028 filed Feb. 24, 1997 entitled "Hybrid Hall Effect Memory Device & Method of Operation," now U.S. Pat. No. 6,064,083. Ser. No. 08/806,028 is a continuation-in-part of Ser. No. 08/643,805, filed May 6, 1996 titled "Hybrid Hall Effect Device and Method of Operation," (now U.S. Pat. No. 5,652,445), which in turn is a continuation-in-part of an application Ser. No. 08/493,815, filed Jun. 22, 1995 titled "Magnetic Spin Transistor Hybrid Circuit Element," (now U.S. Pat. No. 5,565,695); and said Ser. No. 08/806,028 is also a continuation-in-part of an application Ser. No. 08/425,884, filed Apr. 21, 1995 titled "Magnetic Spin Transistor, Logic Gate & Method of Operation," (now U.S. Pat. No. 5,629,549); and an application Ser. No. 08/643,804 filed May 6, 1996 titled "Magnetic Spin Injected Field Effect Transistor and Method of Operation," (now U.S. Pat. No. 5,654,566).

The above applications and materials are expressly incorporated by reference herein.

FIELD OF THE INVENTION

The invention relates generally to hybrid memory devices. In particular, the present invention relates to a new nonvolatile stacked hybrid memory element using magnetic spin devices.

BACKGROUND OF THE INVENTION

Solid state Random Access Memories (RAM), presently based on silicon technology, are the most important high-speed, reprogrammable memories in computer systems today. The content of a memory bit is stored in a circuit element called a cell, fabricated in a silicon Integrated Circuit (IC) chip. Each cell can exist in one of two stable states to represent a "0" or a "1." A word is stored in a particular group of cells in a memory array and can be identified with, and addressed by, a unique numerical address. Thousands to millions of cells can be fabricated in a single Very Large Scale Integrated (VLSI) chip along with additional address decoding and read/write control circuits. Given the address of any word, the memory content of that word can be retrieved during a memory operation time cycle, typically between 5 and 200 nsec. Any given bit can be addressed, written, rewritten, read and reread repeatedly, with fast access, read and write times. The desired attributes of RAM include high speed, low power dissipation, high packing density, and inexpensive manufacturing cost. Although the technology for address decoding, read/write control and read sensing is fairly standard, the kind of circuit element that is used to comprise each memory cell can vary widely and is the subject of much research and development.

Conventional DRAM

The Dynamic Random Access Memory (DRAM) cell is popular because the cell size can be made small, leading to a high packing density and relatively low cost. The storage element is a capacitor C and the two stable states can be, for example, the states with stored charge Q and with stored charge 0. Every cell is connected to an array of write and read wires, also called "bit" and "word" lines. Since one capacitor linked together with other capacitors in an array can lose its charge to its neighbor, the capacitor of each cell is connected to a transistor in that cell so as to isolate it from the array. When the transistor is "on" there is a low resistance to a write or read wire so that an applied voltage can charge the capacitor or a sense circuit can determine the stored charge. When the transistor is "off" there is a high impedance to the write or read wire which isolates the capacitor electrically from any other element in the array.

The packing density of DRAM memories has undergone steady improvement for more than two decades. Early DRAM cells used several capacitors and transistors, but now the most common designs use a single capacitor and single transistor because minimizing the number of elements in a cell allows the size of the cell to be reduced to a minimum. Typically, a Metal Oxide Semiconductor Field Effect Transistor (MOSFET) is fabricated by standard lithographic processing techniques on a silicon substrate. The oxide that isolates the gate from the channel is highly insulating, so that the metallized gate has a capacitance to the rest of the device. In early designs, e.g. with 3 elements per cell, the gate capacitance was used as the storage capacitance. Single element cells use a MOSFET and a separate capacitor C. Reading is performed with a sense circuit that compares the charge (or voltage) of C with the charge (or voltage) of a standard capacitor C in a dummy cell. For an accurate readout, the charge Q stored on the capacitor must be the order of 1 million electrons or more. While FETs have benefited from advances in processing techniques so that they can be fabricated with dimensions smaller than a micron, capacitors have not benefited from similar gains in technology and it is still necessary for capacitors to have dimensions of order one micron or larger in order to hold the necessary charge. Thus, the size of DRAM memory cells is not decreasing as rapidly as processing technology would allow, and one significant drawback of DRAM is that reliable cells might never be fabricated on a submicron scale. Furthermore, the necessity of comparing capacitance with that of dummy cells requires the fabrication of dummy cells which take up extra space on the chip. A second disadvantage, for some cell designs, is that the read process drains whatever charge is stored on the capacitor. This phenomenon is known as "destructive readout" because the read process destroys the state of the cell (capacitor), and a rewrite circuit must be provided to rewrite the memory after every read. The rewrite circuit takes up space on the chip and the rewrite process can lengthen the amount of time of the read cycle. A third weakness is that the capacitor plate of any cell is never perfectly isolated. There is always some finite impedance to ground which permits the charge to leak from the capacitor, and in this process the memory is also lost. To remedy this, a refresh circuit is used to rewrite the memory constantly, typically once every few milliseconds. The refresh circuit takes up space on the chip, uses Central Processing Unit (CPU) time, lengthens the time of the read cycle, and dissipates extra power [typically 0.1 to 0.2 watts per megabyte of RAM]. The power dissipation is of particular concern for memories that are powered by batteries, such as laptop computers, mobile communications equipment, and satellite electronics. DRAM cells derive the name "dynamic" because the memory is dynamic, i.e. it is constantly being refreshed, and memory cells which lose their memory when not being powered are called volatile. A fourth problem with DRAM is that a particle radiation, either from background sources or from contaminants on the chip, can cause a spurious discharge of the capacitor and give a false reading. This is one of the largest error mechanisms limiting the reliability of DRAM.

More recently, cell circuit elements other than typical oxide dielectric capacitors have been proposed to serve as nonvolatile memory storage elements. The chief advantage of a Nonvolatile Random Access Memory (NRAM) is that memory is retained even when the array is not being powered. Thus, power dissipation is minimized since the array draws zero quiescent power. Furthermore, refresh circuitry is eliminated, thus saving space on the chip and requiring less time of the CPU. One category of nonvolatile circuit elements utilizes magnetic materials and their properties. For example, one kind of nonvolatile memory cell uses a circuit element similar to that of DRAM, but the dielectric material of the capacitor is ferroelectric, i.e. the capacitance has two different values for two different states of the dielectric which are determined by application of a magnetic field. Although this cell is nonvolatile, the dielectric properties of the ferroelectric material are relatively weak so that the size of the capacitor C must be fairly large and therefore the cell size is necessarily large. This structure has similar limitations to the oxide dielectric capacitors described above: the read process is destructive, the cells are susceptible to $\alpha$ particle radiation. Finally, the ferroelectric material degrades with time so that the cell is incapable of sustaining an infinite number of read and write cycles.

Other kinds of circuit elements for nonvolatile memory cells use ferromagnetic materials rather than ferroelectric materials. Two different approaches use magnetoresistive elements as the storage elements of the cell.

MRAM

Magnetoresistive Random Access Memory (MRAM) (described in an article by James Daughton, "Magnetoresistive Memory Technology," Thin Solid Films 216, 162 (1992) which is incorporated by reference herein) employs an array of bit and word lines. Each bit line is divided into n storage cells. Each cell is a trilayer composed of a ferromagnetic metal base layer, a nonmagnetic metal middle layer, and a ferromagnetic metal top layer. The cell has length l, width w and thickness d. Looking at a cell in cross section across the width, there are two stable magnetizations states, each with the magnetization of the two ferromagnetic films oriented in opposing directions: clockwise and counterclockwise. The resistance of each cell, measured with a sense current applied along the length of the cell, is $R_1$ when the magnetizations are perpendicular to the sense current (as is the case for the stable magnetization states) and $R_1'$ if the magnetizations of the ferromagnetic layers are forced to lie parallel to the sense current. Each cell in the bit line is connected to the next cell with a conducting strip which has resistance $R_c$. Columns of n word lines cross the m rows of bit lines. Each nonmagnetic word line crosses the top of a cell in each bit line.

The state of cell (i,j) is written by sending current pulses of appropriate amplitude through bit line i and word line j, causing the magnetization of the cell to orient either clockwise or counterclockwise. The contents of the cell are read by first biasing word line j with a large enough current so that the magnetizations of both ferromagnetic layers are canted to an orientation that is approximately 45 degrees away from the axis of the bit line. In this orientation the resistance of the cell (for a sense current applied along the bit line) has a value $R_2$ that is between $R_1$ and $R_1'$. Next, a sense current is applied along the bit line, and a voltage is measured across the bit line, having a value proportional to $(n-1)R_1+R_2+nR_c$. Finally, a read current pulse is applied to the word line, in addition to the original bias current. This current pulse changes the magnetization orientation in a direction more nearly parallel to the sense current if the initial orientation was clockwise, or in a direction more nearly perpendicular to the sense current if the initial orientation was counterclockwise. Thus, the voltage across the bit line either increases or decreases when the read pulse is applied. A sense circuit that measures changes of voltage [a derivative circuit] records the positive or negative change as a "1" or a "0."

By using a derivative sense technique, MRAM avoids the necessity of electrically isolating each cell. However, the signal to be sensed is quite small and the signal to noise ratio is poor. The change in resistance that must be sensed during the read process is a small fraction of $R_1$, and this small change must be distinguished from a background of approximately $n(R_1+R_2)$. In practice, two elements are fabricated for each cell [thus doubling the signal], and the read process is repeated several times so that the final readout is taken as an average of repeated samplings [thus lowering the noise]. This increases the time for a read cycle. Power dissipation is relatively large during readout because relatively large currents must be applied to long, resistive lines. Finally, errors can be introduced during readout if the bias current tips the magnetization into an unstable state.

NRAM with Magnetoresistive Element

Another approach uses a magnetoresistor R as the storage element, and the cell is comprised of R, a reference resistor R', and means (such as one or more FETs) to isolate the cell from the rest of the array. The magnetoresistor R is typically a thin film ferromagnetic metal (or ferromagnetic/nonmagnetic metal multilayer) resistor with length l, width w and thickness d, and has two values, R' and R'+$\delta$R, corresponding to two stable magnetization states. For example, in one state the magnetization of a permalloy film might be parallel to the direction of flow of the sense current, $I_{sense}$, and in the other state the magnetization might be perpendicular to $I_{sense}$. The magnetization state is written by using the magnetic field generated by current pulses applied to an array of write wires. The read process begins by selecting a cell, for example by switching the isolating FETs to the "on" state by driving the appropriate word line to a high voltage. A bias current $I_{sense}$ is applied to the magnetoresistor R and the reference resistor R'. A sense circuit at the end of a line of cells compares the two voltages and interprets a "1" or "0" when, for example, $I_{sense}*(R-R')>0$ or $I_{sense}*(R-R')=0$ respectively. The voltage levels corresponding to "1" (and "0") are then amplified to TTL or CMOS levels. The voltage $I_{sense}*\delta R$ that distinguishes a "1" from a "0" must be large enough for reliable discrimination. Since the magnetoresistive ratio $\delta R/R'$ of ferromagnetic films (or multilayers) is small, 10 percent or less, the magnetoresistor must be made quite large. For example, with R'=100 $\Omega$ and $\delta R/R'$=0.1, a reasonable bias current of 1 mA would produce a detectable voltage difference of 10 mV.

This approach has several disadvantages. Resistors require substantial area in a cell. For example, the 100 $\Omega$ magnetoresistor could be fabricated, using ferromagnetic materials with resistivities of about 20 $\mu\Omega$-cm, with a length l=5 µm, width w=1 µm, and thickness d=0.01 µm. Since this cell requires the fabrication of two resistors, substantial space is used. The reference resistor cannot be placed outside the cell because the resistive difference, δR, is so small that the resistance of each cell must be matched to a particular reference. Since resistance is a function of temperature, R=R(T), the reference resistor must be fabricated very near the magnetoresistor so that both resistors will always be at the same temperature, and the material for the reference resistor must be carefully chosen so that the temperature dependence of its resistivity is similar to that of the magnetoresistor. Finally, the resistance of each cell is quite large. When numerous cells are placed on a single read line, as in an array, the resistance of the read line is substantial. Since the read process uses current bias, the power dissipated in each read cycle is relatively large.

Magnetic Spin Transistor

The Magnetic Spin Transistor is described in recent articles (see, e.g., Mark Johnson, "The All-Metal Spin Transistor," IEEE Spectrum 31 (5), 47 (1994), and Mark Johnson, "The Bipolar Spin Switch," Science 260, 320 (1993), which are incorporated by reference herein) as a novel device that can be used as a circuit element in a nonvolatile memory cell. Two characteristics of the device must be considered when using the device in an NRAM array. First, the device can be fabricated entirely from metals, and is therefore characterized by a low electrical impedance. Thus, to fabricate an array of such elements it is necessary to electrically isolate each element from others in the array, so that the output of any element will not be shorted to ground through a neighboring element. Second, [like many other memory elements] the output voltages available from the device are less than TTL or CMOS levels, and the output must therefore be amplified before it is incorporated in TTL or CMOS circuits.

Previous NRAM cell designs using the spin transistor as a memory element have approached the above constraints in two ways. In the first, the memory cell is comprised of a spin transistor and a differential amplifier. The amplifier also provides cell isolation. The drawback of this approach is that each cell requires a significant amount of space on a chip, and the complicated fabrication procedures required for circuits composed of numerous transistors will drive up the cost per bit of the memory. In the second approach, the cell is composed of a spin transistor and one or more capacitors and resistors. The passive elements provide isolation for the spin transistor of each cell, and the readout voltage is transmitted to the end of a line of elements where amplification is performed. The disadvantage here is that passive circuit elements, in particular resistors and capacitors, require substantial space on a chip. Thus, the majority of cell area is occupied by passive elements and packing densities are limited. Furthermore, cell isolation is not very efficient and the readout voltage can be degraded during transmission to the sense circuit, resulting in higher noise and lower readout sensitivity.

SUMMARY OF THE INVENTION

An object of the present invention therefore is to provide a new, nonvolatile, smaller storage element with greater isolation and superior signal to noise readout characteristics, for use as the storage cell in a [random access] memory circuit.

Another object of the present invention is to minimize support circuitry on the chip by eliminating dummy memory cells and rewrite and refresh circuits.

Another object of the present invention is to shorten the time of the read cycle by eliminating the rewrite process.

Another object of the present invention is to increase the efficiency of a CPU by eliminating the refresh process.

Another object of the present invention is to reduce power consumption by making the memory nonvolatile, and to reduce the power used during a current biased read cycle by minimizing the resistance of the storage element of each cell.

Another object of the present invention is to minimize memory errors caused by radiation by using a storage element that is impervious to the effects of α particles.

According to the present invention, an improved memory cell for NRAM is a hybrid composed of a magnetic spin transistor and a semiconducting isolation element which can be a FET or other similar device. Data can be read out of the memory cell by applying a select signal to the FET. Similarly, data can be written to the magnetic spin transistor by using a conductive write layer for carrying a write electric current and inductively coupling a write magnetic field associated with this write current to a ferromagnetic collector layer of the spin transistor.

As with other magnetic spin transistor designs, the ferromagnetic emitter and ferromagnetic collector layers of this new transistor are both fabricated to be magnetically anisotropic so as to permit the collector to have two stable magnetization states (up and down). An external current generator can change the magnetization state of the collector by inductively coupling a magnetic field to the collector. Even if power is removed from the above device, the ferromagnetic collector layer magnetization orientation is retained in its set state, thus causing the spin transistor to behave as a non-volatile memory element, because the two states of the magnetization orientation of said second ferromagnetic layer can correspond to data values stored in said memory element. The magnetic spin transistor can be fabricated on a semiconductor substrate (such as silicon) or on top of an insulating, dielectric layer that coats (and passivates) a portion of a semiconducting device.

The isolation element can be formed from a typical FET that is provided having a source, drain and gate with a conducting channel between the source and drain the conductance of which depends on the voltage applied to the gate: the conductance is low when no voltage is applied to the gate and high when voltage is applied.

In another embodiment, the hybrid element is used as each cell in an array of cells. The drain of the FET is attached by a conducting path to a common bit line, the emitter of the magnetic spin transistor is attached to a common read line, and the gate of the FET is attached to a common word line operated synchronously with the read line.

According to the present invention, the spin transistor is the storage element, with write and read operations performed in a way similar to previous spin transistor NRAM cells. Similar to its use in a DRAM cell, the semiconductor transistor is used to isolate the spin transistor from the array except when it's being read, and can be called a "cell select" transistor. The cell of the present invention is thus composed of only two elements, and each element can be fabricated at the limits of processing technology; there is nothing known that will prevent the realization of submicron cell dimensions. Amplification can be provided by sense circuits at the ends of the array lines. As the cell size is decreased, the readout voltage may be degraded by as yet unknown processing factors. In this case some amplification can be provided by preamplifiers associated with blocks of cells.

The improved, hybrid memory cell is superior to the previous spin transistor memory cell because the cell size can be made much smaller and cell isolation is much greater. The hybrid memory cell has numerous advantages over other kinds of memory cells. The memory element is a spin transistor and therefore a bipolar voltage output can be provided. Thus, the discriminator of the sense circuit can be set to zero (ground) thereby enhancing the ease of readout. Since ground can be made constant at every location on the chip, no dummy cells, reference voltages, nor reference resistances are needed.

The hybrid memory cell has specific advantages over DRAM. Memory is nonvolatile, so the cell draws zero quiescent power. The cell can be fabricated with smaller dimensions since no passive elements (e.g. no capacitors) are used. Because readout is nondestructive, refresh circuitry and dummy cells can be eliminated from the chip. Since spin transistors are made from metals they are not susceptible to a particle radiation, and the memory is radiation hard.

The hybrid memory cell has specific advantages over MRAM. The readout voltage is larger, with a superior signal to noise characteristic, so that read times are much shorter. The bias current is smaller so that the power dissipated during the read cycle is much less. The packing density is greater because the magnetoresistive element in the MRAM cell is larger and because each MRAM cell requires two elements.

The hybrid memory cell has specific advantages over NRAM designs that use magnetoresistive elements. Since the spin transistor can have a bipolar output, the discriminator of a sense circuit can be set to zero, which should be constant everywhere on the chip, and no reference resistance is needed. The cell has fewer elements and can be made much smaller, resulting in larger packing densities. Whereas a magnetoresistive element must be fabricated on a large size scale so that its resistance is large enough [and therefore δR is large enough] to produce a reliably detected voltage, the spin transistor scales inversely with sample size. In other words, the transimpedance of a spin transistor becomes larger as the dimensions of the device are made smaller. A spin transistor with interfacial area of 1 μm by 1 μm has a transimpedance of 10 Ω (identical with δR of the larger magnetoresistor) but has a parasitic resistance (the resistance which dissipates power when current biased) of only a few ohms. Thus, an array of hybrid spin transistors dissipates less power during the read operation.

DETAILED DESCRIPTION OF THE INVENTION

Before explaining the details of the new hybrid spin transistor memory cell, a brief review of the operating principles and device characteristics of the spin transistor will be provided for purposes of putting the present invention in context. While specific details of the physics of these devices is not important for purposes of the present invention, a more detailed discussion can be found in the aforementioned Science and IEEE Spectrum articles.

Figure 1:
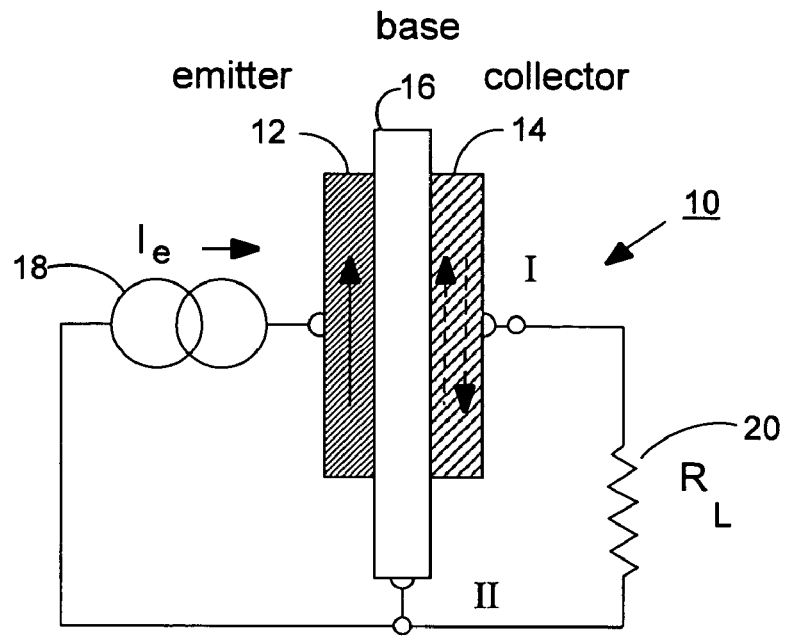
FIG. 1 is a cross-sectional view of a trilayer structure illustrating the basic structure and operation of a typical magnetic spin transistor.

Most embodiments rely on a trilayer structure drawn schematically in cross-section in FIG. 1. Ferromagnetic emitter 12 and ferromagnetic collector 14 are thin films of iron, cobalt or permalloy, $Ni_xFe_{1-x}$, although any electrically conductive, single domain ferromagnetic layers may be used. Paramagnetic base 16 is gold, copper, or aluminum, but any conductive paramagnetic material, i.e, any material having electron levels that are not significantly affected by the electron spin so that there is little splitting between the spin subbands, is acceptable. The equilibrium energy levels for typical paramagnetic materials are substantially the same for the two electronic spins. Alternatively, a non-paramagnetic material that can be made paramagnetic through known means is also acceptable.

It will be understood by skilled artisans that the terms "ferromagnetic emitter," "paramagnetic base" and "ferromagnetic collector" serve as short hand descriptive aids in this field for understanding the present invention. In some ways, these terms suggest a natural analogy with semiconductor devices. While such analogies may be helpful pedagogical notions, no limitations or relationships typically associated with or between such structures in the physics of semiconductor transistors should be presumed to apply to the corresponding ferromagnetic and paramagnetic regions of the present invention. A full understanding of the limitations and relationships of such regions in the present invention is provided herein, in the above articles, and in other prior art materials discussing magnetic spin transistors.

Each of the three films typically has a thickness greater than an electron mean free path, typically tens to hundreds of nanometers. The thickness of the paramagnetic base 16 is preferably less than the spin diffusion length $\delta_s$, typically of order 1 micron in polycrystalline metal films such as gold, copper, silver, aluminum or niobium, and defined to be the length 1 in the paramagnetic base over which an induced nonequilibrium magnetization M_ diffuses while the amplitude diminishes to 1/e of the initial value, $M_- = M_{-0} e^{-1/\delta}$.

In general the orientation of the magnetizations of the ferromagnetic emitter 12 and ferromagnetic collector 14, $M_E$ and $M_C$, can lie in any direction. It is common to use ferromagnetic materials with in-plane anisotropies so that $M_E$ and $M_C$ are restricted to lie in the plane of the films, in which case the device has a continuum of states with each state corresponding to the projection of the magnetization of $M_C$ on $M_E$. For digital storage applications, the device is preferably fabricated using ferromagnetic films with parallel anisotropy axes in the film plane. The ferromagnetic emitter 12 is fabricated from a material with a large coercivity [and/or a large exchange bias or pinning anisotropy] and the ferromagnetic collector 14 is fabricated from a material with a smaller coercivity. Thus, $M_E$ is initially polled in the up orientation, denoted in FIG. 1 by the up arrow within the ferromagnetic emitter 12, and it remains in this state. Under these conditions a spin transistor acts as a two state device, corresponding to the two stable states of $M_C$, up and down (parallel or antiparallel to $M_E$). These two equally likely states are represented in FIG. 1 by the dashed arrows, up and down, within the ferromagnetic collector 14. For the chosen convention of $M_E$ up, the two device states are determined by the state of $M_C$ and are hereafter labeled as "up" and "down." Those skilled in the art will appreciate that $M_E$ could be chosen down and a two state device would exist with opposite output polarity; moreover, an equivalent notation, sometimes used in the literature, is $M_E$ and $M_C$ parallel or antiparallel.

A conventional spin transistor such as shown in FIG. 1 is a three terminal, current biased, low impedance device with a bipolar voltage or current output that depends on the state of the device [i.e. that depends on the projection of $M_C$ on $M_E$]. An electrical source 18 pumps positive bias current $I_E$ from the ferromagnetic emitter 12 to the paramagnetic base 16 and creates a nonequilibrium population of spin polarized electrons, equivalently a nonequilibrium magnetization $M\_$ in the paramagnetic base. In the simplest analysis, much of the bias current returns to the source by the path through node II. The nonequilibrium magnetization in the paramagnetic base generates an electric field at the paramagnetic base—ferromagnetic collector interface, and the sign of the field depends on the magnetization orientation of the ferromagnetic collector $M_C$ with respect to the orientation of the polarized electrons, and therefore with respect to $M_E$. When $M_E$ and $M_C$ are parallel the electric field generated at the interface pushes electric current from the paramagnetic base into the ferromagnetic collector, and when they are antiparallel the field pulls electric current from the ferromagnetic collector into the paramagnetic base.

Since current in the circuit of FIG. 1 is conserved, the interfacial electric field can be considered as a "battery" that generates a circulating current in the ferromagnetic collector arm of the circuit, either clockwise or counter-clockwise. Quantitatively, the interfacial electric field that is generated by the nonequilibrium population of polarized spins can be described by a transimpedance $R_S$. The spin-coupled voltage $V_S$ developed across the interface is linearly proportional to bias current, $R_S = |V_S|/I_E$, where $R_S$ is defined as positive and $V_S$ is bipolar. The magnitude of $R_S$ is inversely proportional to the volume of the paramagnetic conducting material (the paramagnetic base) between the ferromagnetic emitter and ferromagnetic collector, and can be of the order of ohms for devices fabricated with a spatial scale on the order of a micron.

In FIG. 1, the ferromagnetic collector arm of the circuit contains an arbitrary (selectable) load resistance 20, also called $R_L$. The response of the spin transistor to several loading configurations can now be discussed.

In the first extreme case let $R_L \Rightarrow 0$ so that the ferromagnetic collector arm of the circuit behaves as a short circuit ammeter. Then current flow in the ferromagnetic collector arm will be clockwise and positive, from node I through $R_L$ to node to II, when $M_C$ is up [$M_E$ and $M_C$ parallel], and counter-clockwise and negative (current will flow from II to I) when $M_C$ is down [$M_E$ and $M_C$ antiparallel].

In the second extreme case let $R_L \Rightarrow \infty$ so that the ferromagnetic collector arm of the circuit represents an open circuit voltmeter. Then the voltage $V_I$ at node I is positive with respect to the voltage at the paramagnetic base, $V_I > V_{II}$, when $M_C$ is up, and $V_I$ is negative with respect to the paramagnetic base when $M_C$ is down.

Magnetic Spin Transistor with Adjustable Output Offset

Figure 2:
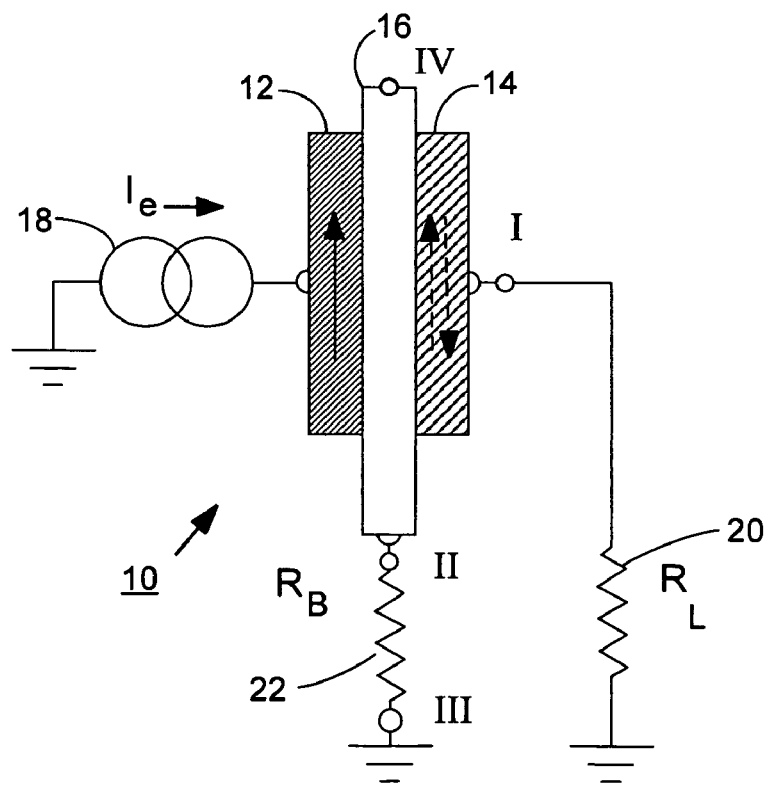
FIG. 2 is a cross-sectional view of the trilayer structure in FIG. 1 showing an embodiment of an improved magnetic spin transistor wherein circuit elements are used to offset the output current or voltage.

A first embodiment of my improved spin transistor design is shown electrically in FIG. 2. This embodiment shows changes that I have discovered more realistically model spin transistor devices as real circuit elements. First, separate grounds have been drawn for the electrical source 18, paramagnetic base 16 and ferromagnetic collector 14 to represent the fact that these components may be grounded at spatially remote parts of a circuit. Second, a parasitic resistance 22, also denoted $R_B$ has been explicitly included between the paramagnetic base and ground. This represents the fact that there is always some finite resistance from the paramagnetic base to ground including, for example, the intrinsic resistance of the paramagnetic conducting material comprising the paramagnetic base itself. In typical prior art spin transistor embodiments, $R_B$ is considered to be negligibly small or exceedingly large, and in these embodiments the output current or voltage is limited to be symmetrically bipolar.

In the present invention, $R_B$ is adjusted relative to the transimpedance $R_S$ to permit the output of a spin transistor to be offset by any desired amount to effectuate anything from a full bipolar to a unipolar output for any known load resistance $R_L$. The adjustment of $R_B$ relative to the transimpedance $R_S$ can be accomplished by altering the geometry of the paramagnetic base 16 relative to the ferromagnetic emitter 12 and ferromagnetic collector regions 14, such as by varying the thickness and transverse dimensions of the paramagnetic conducting material outside the region between ferromagnetic emitter and ferromagnetic collector, or introducing a low transmission barrier at either interface or at any boundary to the paramagnetic base region (the region between ferromagnetic emitter and ferromagnetic collector), or by using different materials for the paramagnetic base such as niobium. In this manner, $R_B$ can be made to be on the same order, or larger than the transimpedance $R_S$.

Magnetic Spin Transistor with Write Wire

Figure 3:
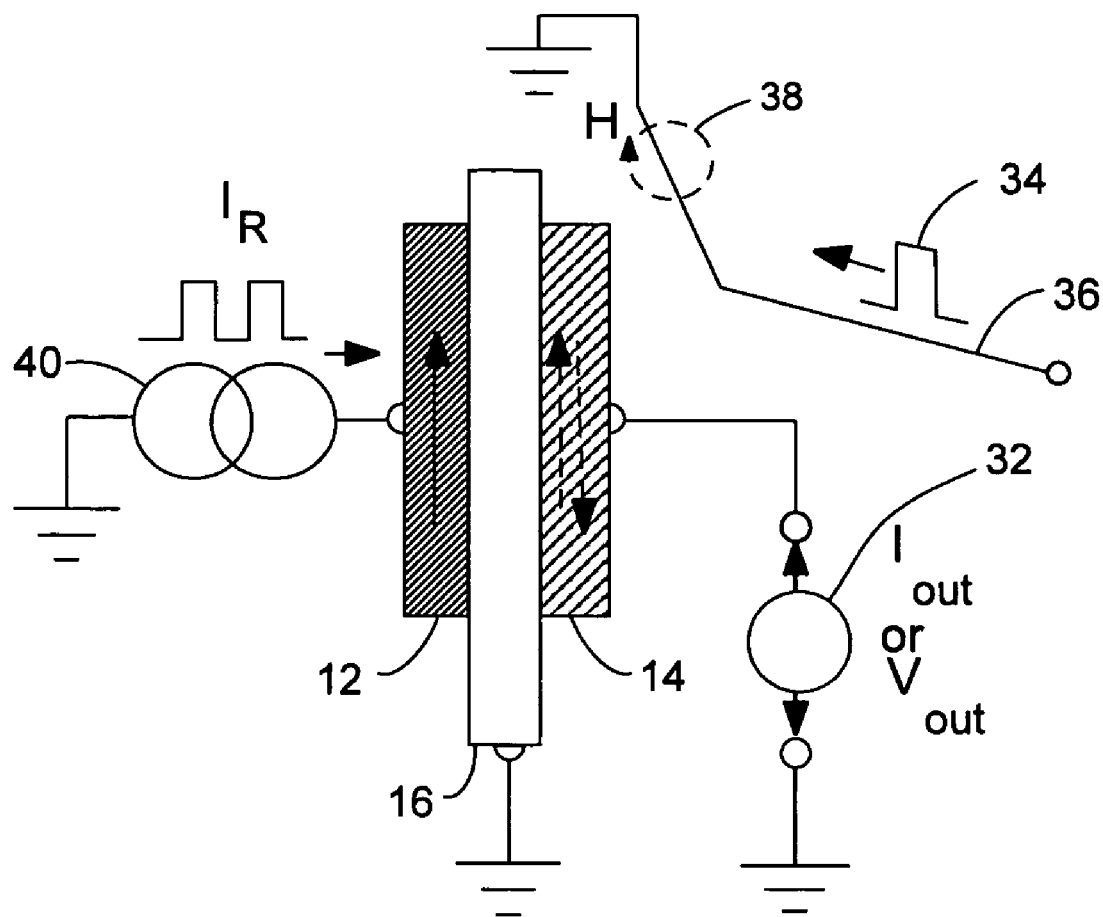
FIG. 3 is a cross-sectional view of the trilayer structure of an improved magnetic spin transistor invention which is usable for any number of operating environments.

The operation of an improved spin transistor invention 10 is shown in FIG. 3. In this figure, while the spin transistor also includes adjustable offset, the parasitic paramagnetic base resistance $R_B$ has not been included in the drawing and any load resistance has been replaced by a meter [detector] 32 that displays the output current or voltage of the ferromagnetic collector arm of the circuit and has characteristic impedance $R_L$. A bias current can be applied in the form of digital pulses 40; this can also be considered as a read current $I_R$. The orientation $M_C$ of the magnetization of the ferromagnetic collector can be set to a stable state by using localized pulses of magnetic field. An integrated wire fabricated in close proximity to the ferromagnetic collector film 14 is called a write wire 36. A pulse of positive electric current 34, called a write pulse, transmitted down the write wire generates a magnetic field 38 close to the write wire. The write wire is situated so that a positive current generates a field 38 at the ferromagnetic collector that is positive (up in FIG. 3) and the magnetization orientation of $M_C$ will be set upwards in response to this field if it is of sufficient magnitude. When no current is transmitted in the write wire there is no magnetic field and the magnetization orientation $M_C$ retains its initial orientation because of hysteresis. If a sufficiently large negative current pulse is transmitted down the write wire, the associated magnetic field pulse will be negative, pointing downwards at the ferromagnetic collector, and $M_C$ will be set to point down. While element 36 in FIG. 3 has been described as a "wire" it will be understood by persons skilled in the art that any number of well-known structures capable of carrying sufficient current (including for example a conductive film, or an interconnect line) to generate field 38 will be suitable in the present invention.

Figure 3A:
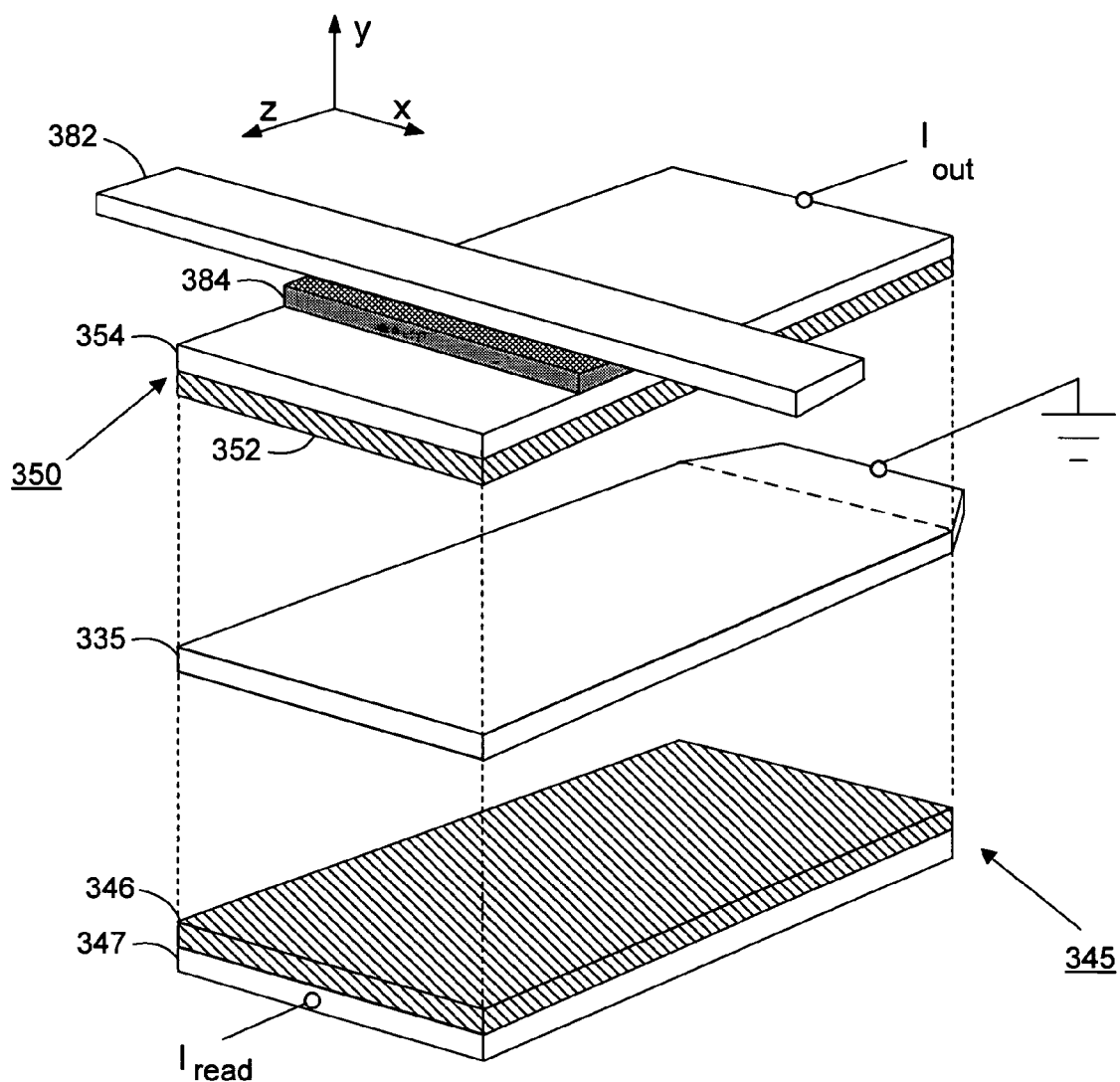
FIG. 3A is a perspective view of same trilayer structure of an improved magnetic spin transistor, showing the paramagnetic base, ferromagnetic emitter, ferromagnetic collector and connections thereto.
Figure 3B:
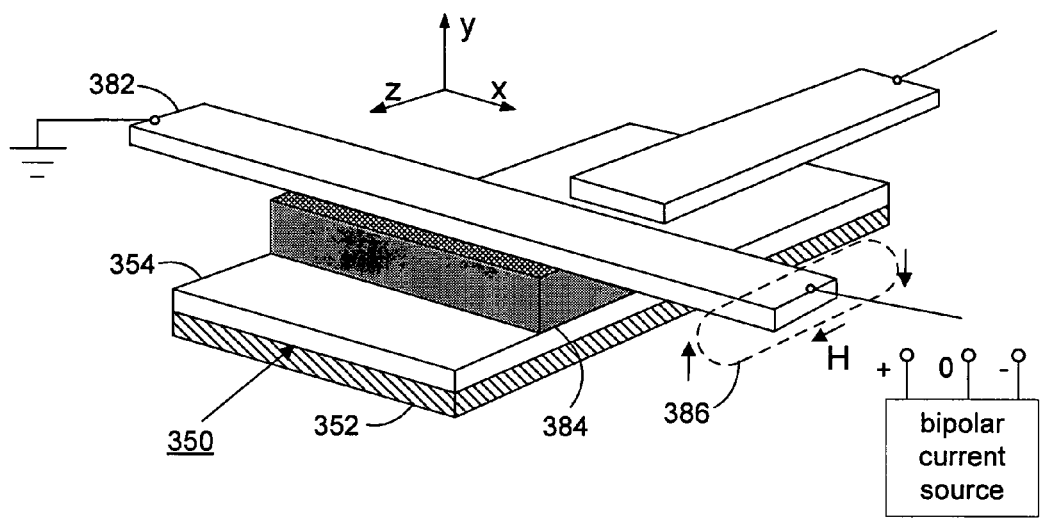
FIG. 3B is a perspective view of a write wire inductively coupled to an improved spin transistor.

The structural configuration of the preferred embodiment of the improved spin transistor shown with an integrated write wire is depicted in FIG. 3B. Ferromagnetic collector electrode 350 is a bilayer composed of ferromagnetic collector 352 and a thin overlayer 354 which serves to improve current flow and to protect the ferromagnetic collector against oxidation. The ferromagnetic collector electrode 350 may be rectangular in shape and may have transverse dimensions ranging from 0.1 to 50 microns. An electrically insulating material 384 coats a portion of the electrode. Write wire 382 (typically a metal film or other strongly conducting film) is fabricated over the insulator 384 so that it is electrically isolated from the ferromagnetic collector. It is understood that this spatial orientation can be inverted with the write wire underneath; in some geometries the spin transistor element can carry some of the current of the write pulse.

In FIG. 3B only a portion of the write wire 382 is shown; the wire extends to contact a bipolar current source at one end and a ground which is preferably a ground isolated from the magnetic transistor ground on the other end. Alternatively, write wire 382 can be connected to a single polarity source (such as a data input source that varies from 0 to some positive value). The vector magnetic field generated by current flow in the write wire 382 points in a circulating direction 386. For positive current the field at the position of the ferromagnetic collector 352 is positive along the z axis. The linear relationship between the magnitude of the field at the ferromagnetic collector 352 and the magnitude of the current in the write wire 382 is described by the inductive coupling parameter α. The field magnitude is directly proportional to the current magnitude, $H=\alpha I$. As is well known in the art, α depends on the detailed geometry of the write wire 382, ferromagnetic collector electrode 350, and their spatial relationship. As such, it can be selected by a skilled designer to have any desired value. It is understood, for example, that α decreases as the thickness of the insulating layer 384 increases. In the preferred embodiments shown herein, α is chosen to have a value between 5 and 20 (in practical units where I is in amps and H in tesla).

The amplitude of the write pulse is determined so that the amplitude of the local magnetic field at the ferromagnetic collector is greater than (sufficient to overcome) the coercivity of the ferromagnetic collector and thus set the ferromagnetic collector to a different magnetization state. Again, it is well known in the art that the amplitude of the local magnetic field amplitude impressed on the ferromagnetic collector depends on the value of the inductive coupling parameter α, and the amplitude of the write current pulse. In the preferred embodiment, the write pulse has a current amplitude of 0.1 mA, and the amplitude of the local magnetic field is about 10 Oersted ($\alpha=8$). The coercivity of the ferromagnetic emitter and ferromagnetic collector is selected to be 40 and 8 Oersteds respectively. The choice of specific current amplitude, field strength and coercivities to be used can be easily determined by one skilled in the art depending on the specific application desired.

In the detailed preferred embodiment shown in FIG. 3A, the ferromagnetic emitter 345 is typically a bilayer composed of a ferromagnetic conductor 346 made of iron, permalloy or cobalt (with a thickness 0.06 micron, a length of about 2 microns and a width of 1 micron) fabricated on a nonmagnetic conductor 347 which is used either to promote a magnetic anisotropy in the ferromagnetic conductor 346 (in which case the material could be nickel oxide with a thickness of 0.01 micron) or to promote isotropic current flow into the ferromagnetic emitter 345 (in which case the material would be gold, silver, aluminum or copper with a thickness of 0.08 micron). The ferromagnetic collector 350 is a bilayer composed of ferromagnetic conducting material 352 with a thickness 0.06 micron, a length of about 2 microns and a width of about 1 micron. Overlayer 354 is made of gold, silver, aluminum or copper, has a thickness of 0.08 micron, a length of 2 microns and a width of 1 micron. Write wire 382 is made of gold, silver, aluminum or copper, has a thickness of 0.1 micron and a width of 1 micron (the length extends out of the figure). Insulating layer 384 is made of polyimide, aluminum oxide, silicon dioxide or silicon monoxide, has a thickness of 0.05 micron, a width of 1.2 microns and a length of 1.5 microns. The paramagnetic base 335 is made of gold, silver, copper or aluminum with a thickness of 0.1 micron, a width of 1 micron and a length of 2 microns.

As will be understood by those skilled in the art, the materials and dimensions described for the above structures are not critical within most reasonable limits. Typically, there are wide ranges of acceptable values for any particular application, and the final choice can be made on the operating requirements of any chosen application for such magnetic spin transistors.

Figure 3C:
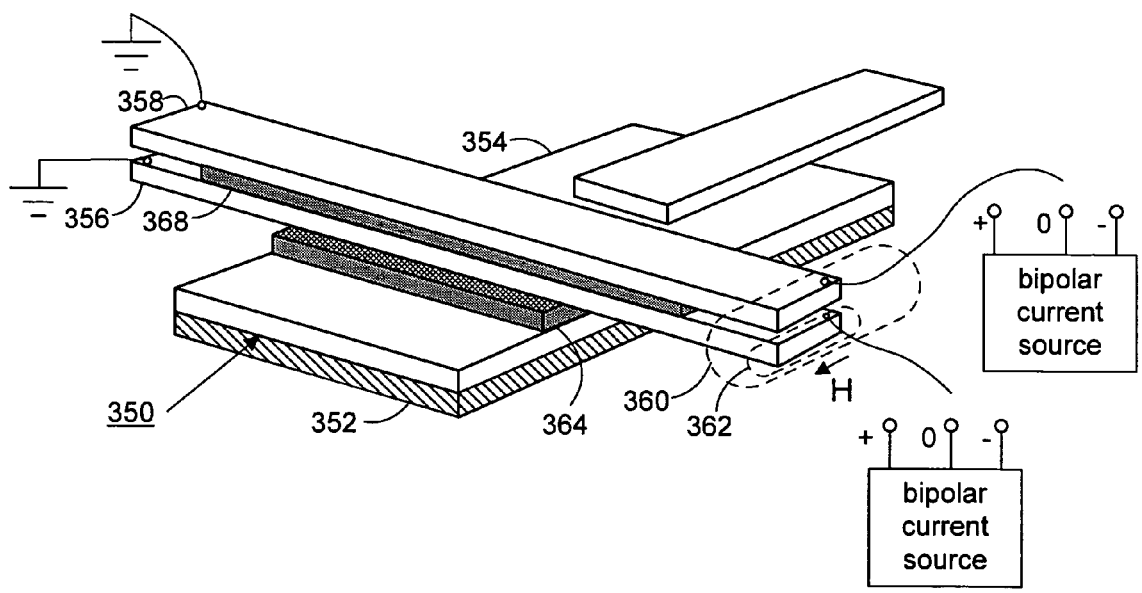
FIG. 3C is a perspective view of two write wires inductively coupled to one spin transistor element in an array of spin transistor elements.

An alternative embodiment of the present invention, depicting the improved magnetic spin transistor is shown in FIG. 3C. In such applications, an array of write wires is used. In FIG. 3C ferromagnetic collector electrode 350 of each element of the array is fabricated in the vicinity of a pair of write wires, and the pair is unique for each element. Write wire 356, a segment of which is shown, is one member [I] of a column of [n] write wires, and write wire 358 is one member [j] of a row of [m] wires, with all n+m wires used to address each of the n*m elements of the [n] by [m] array. Each write wire 356 and 358 is connected to a bipolar current source at one end and ground at the other end, and the two wires are electrically isolated from each other by insulating layer 368 and from the ferromagnetic collector electrode by insulating layer 364.

The magnetic field at each ferromagnetic collector 352 of the array is the sum of the fields 362 and 360 generated from current in each wire 356 and 358. The current amplitude for the pulses simultaneously applied to each line and the inductive coupling parameter for each line are adjusted so that the net field H at each ferromagnetic collector 352 is slightly larger than the coercivity of the ferromagnetic collector. However, the field generated by either write line alone is less than the coercivity. Thus, appropriate current pulses of positive or negative polarity transmitted down the [I] and [j] write lines will orient the magnetization of the ferromagnetic collector of the element at the site with the address (i,j) to be positive or negative (up or down) but the magnetization orientation of the ferromagnetic collectors at other sites in row [I] or column [j] will not be affected.

Figure 4:
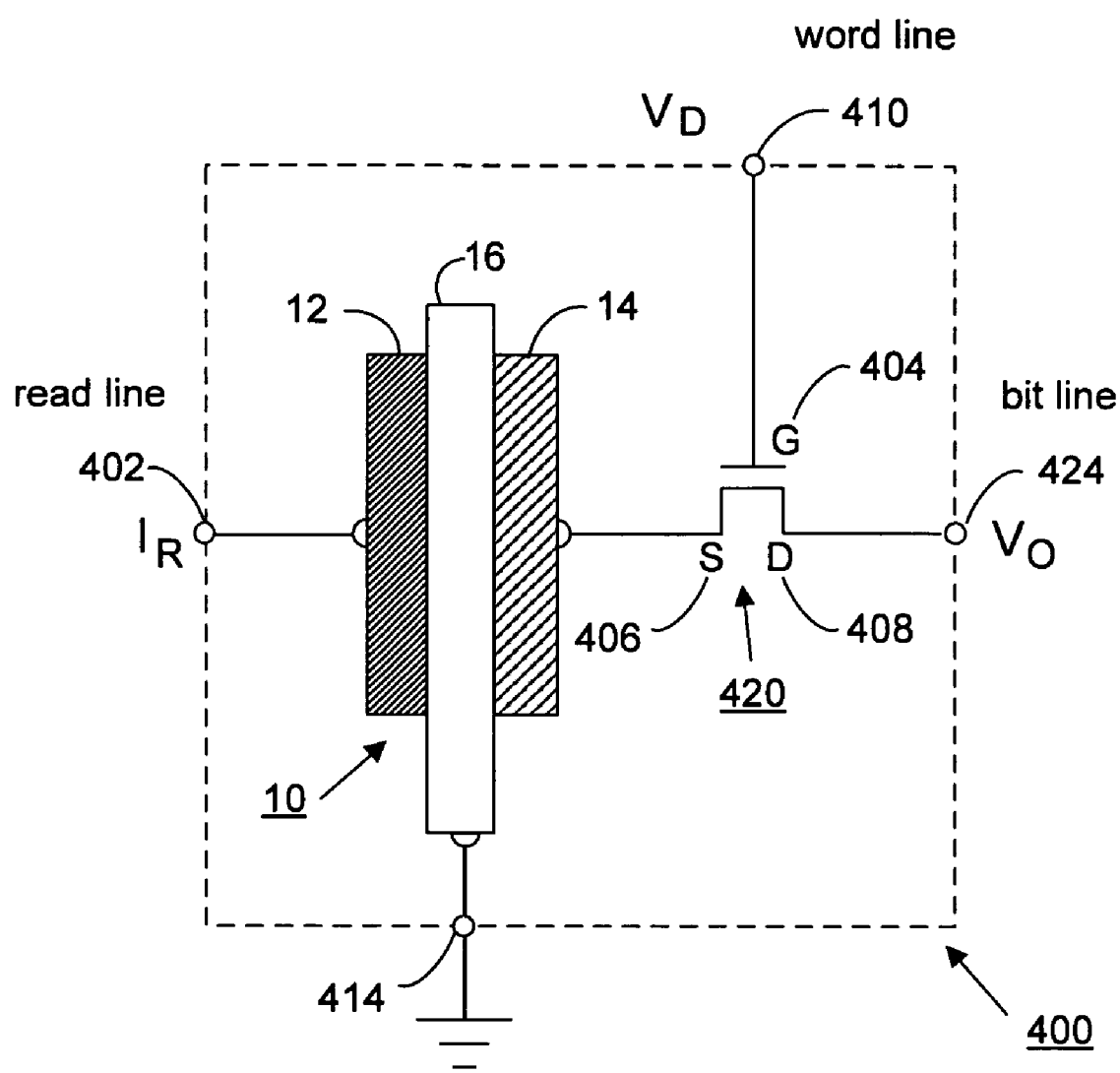
FIG. 4 is a schematic view of a first embodiment of a hybrid spin transistor memory cell comprised of a single magnetic spin transistor and a single select transistor.

First Embodiment of Hybrid Memory Cell with Magnetic Spin Transistor and Associated Fet A first embodiment of a spin transistor hybrid memory cell 400 as it may be used in a memory array is shown schematically in FIG. 4. Write wires are not shown in the figure and write functions are performed in the same manner as described above. A description of the read operation now follows. The cell 400 is denoted by the dotted line surrounding the two circuit elements: a spin transistor 10 is the storage element and a FET 420 [a bjt could also be used] is hereafter referred to as a select transistor. A read pulse $I_R$ applied to the input terminal 402 provides the bias current for reading the state of the spin transistor, e.g. a positive output voltage [with respect to ground] representing a "1" or zero [or negative] voltage representing a "0" is developed at the collector 14 and delivered to the FET source 406. The enhancement mode FET 420 performs a cell select function in the same way as done in a typical conventional semiconductor memory array. Gate 404 is biased at terminal 410 by a voltage $V_D$ which controls the resistance of the source-drain channel beneath gate 404. Normally the gate 404 is not biased, and since the resistance of the source-drain [406–408] channel in this state is very large [order of many MΩ or GΩ] the spin transistor 10 is effectively isolated from the common bit line at terminal 424 and thus from other elements in the array.

When the contents of the cell are to be read, a current pulse, applied through a read [or bias] line and a voltage pulse, applied through a word line are simultaneously applied to the input terminal 402 of the spin transistor and the select terminal 410 of the FET. The source-drain resistance is now low [the range spans the order of 1000 ohms down to less than an ohm] and the output voltage, $V_O$, developed at the collector 14 of the spin transistor is transmitted to the output terminal 424. It is understood that the [terminals] (402, 410, 424) of each cell 400 are connected to wires that are common to all cells in the array. In particular, the bit line that connects to terminal 424 transmits $V_O$ to a high input impedance sense amplifier [or preamplifier] (not shown) at the end of the line as done in other conventional semiconductor memory designs. In designing the detailed characteristics of cell 400, the important criterion (when using a voltage sense amplifier) is that the resistance of the select transistor must be much less than the input impedance of the sense amplifier. In this way only a small fraction of the output voltage is dropped across the select transistor and nearly the full voltage magnitude is available at the sense amplifier input. Since the impedance of the latter can be of order of many MΩ or [even GΩ], the select transistor can be designed using well known and conventional techniques to have an "on" resistance of order 1 Ω up to the order of 10 KΩ. It should be understood that the schematic drawing of FIG. 4, is not drawn to scale, and in practice the spin transistor may be made much smaller that select FET 402. In particular, spin transistor 10 can be fabricated on a scale with dimensions of 1 micron or less, and can preferably, to reduce circuit area, be fabricated on an insulating layer on top of the select transistor. Thus, the hybrid cell can be reduced to size limits imposed only by existing lithographic processing technology.

Second Embodiment of Hybrid Memory Cell

Figure 5:
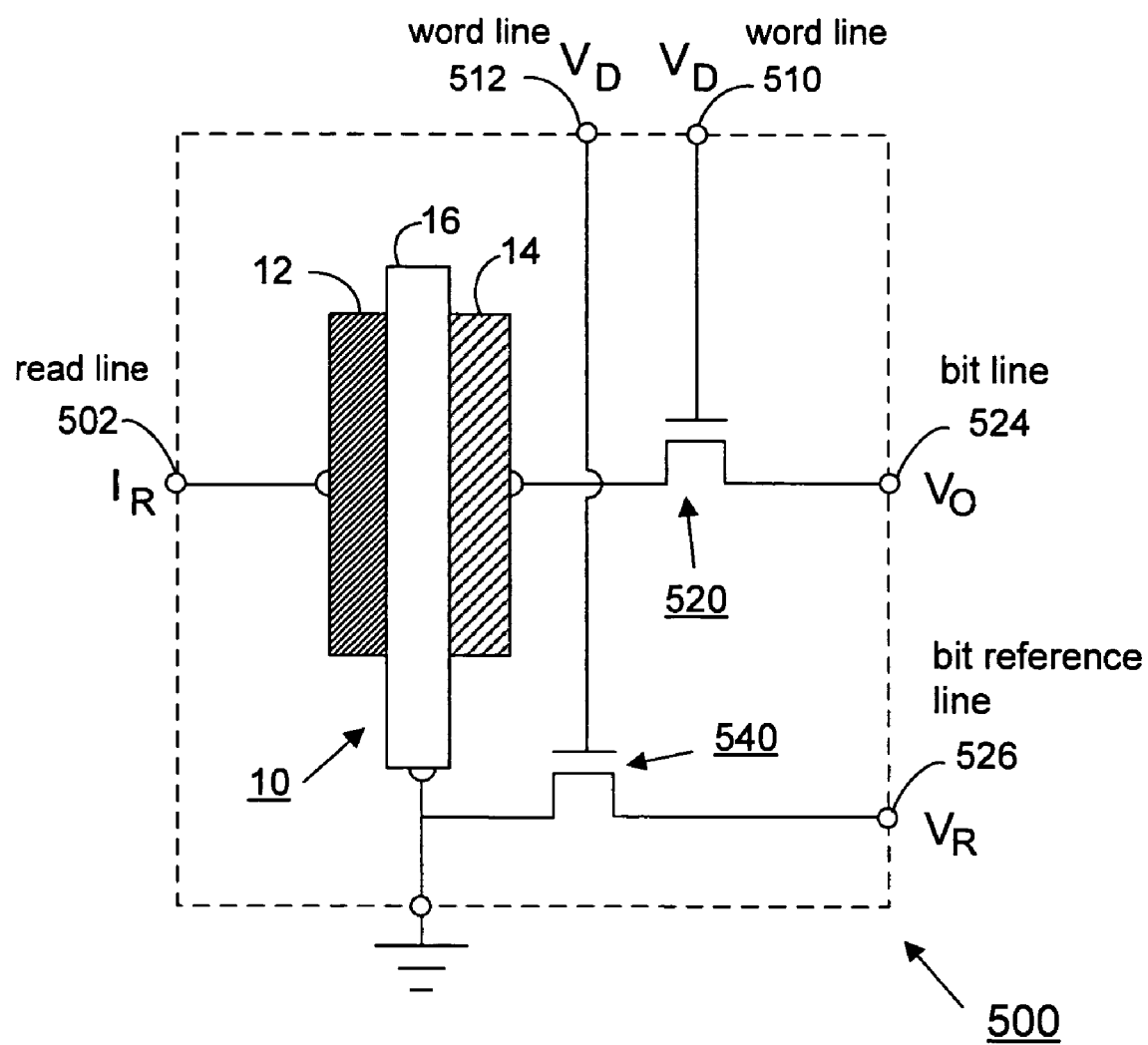
FIG. 5 is a schematic view of a second embodiment of a hybrid spin transistor memory cell comprised of a single magnetic spin transistor and two select transistors.

A second embodiment of a spin transistor hybrid memory cell 500 is shown schematically in FIG. 5. This embodiment is especially suitable for designs where the [electronic] ground plane of the chip is not constant over a large area and, it is therefore advantageous to provide a voltage reference from each cell. In addition, it might be desired to connect the common read line to a column of magnetic spin transistors in series rather than in parallel [i.e. connect the ground of one cell to the input of the next]. In this case it would be necessary to provide a reference [ground] for each cell.

When the ground plane is not constant it may be difficult to utilize a bipolar output. The bipolar output of the spin transistor can be easily offset, however, by manipulating parameters such as $R_B$ and the geometry of the device. For example, it is convenient to offset the output by choosing $R_B=R_S$ so that the voltage output is $2*I_R*R_S$ for a "1" and 0 for a "0." In this case a reference voltage $V_R$ for each cell can be provided at the base 16 of the spin transistor 10. As before, a select transistor 520 isolates the collector 14 from the bit line. Here a second select transistor 540 isolates the base from the bit reference line, where the bit and bit reference lines are common lines for the array and are connected to a sense amplifier, described below. The read operation proceeds in a manner that is similar to that described above. A current pulse [typically of order 1–10 mA], applied through the read [or bias] line, and a voltage pulse [of order 1–5 V], applied through the word line, are simultaneously applied to the input terminal 502 of the spin transistor and the select terminals 510 and 512 of the two select transistors. The source-drain resistance of each transistor is now low and the output voltage $V_O$ developed at the collector 14 of the spin transistor and the reference voltage $V_R$ from the base 16 of the spin transistor are available at the output terminal 524 and reference terminal 526. A bit line and a bit reference line, common to the elements in a column of the array, transmit $V_O$ and $V_R$, respectively, to a high input impedance sense amplifier [or preamplifier] at the end of the line.

Figure 6:
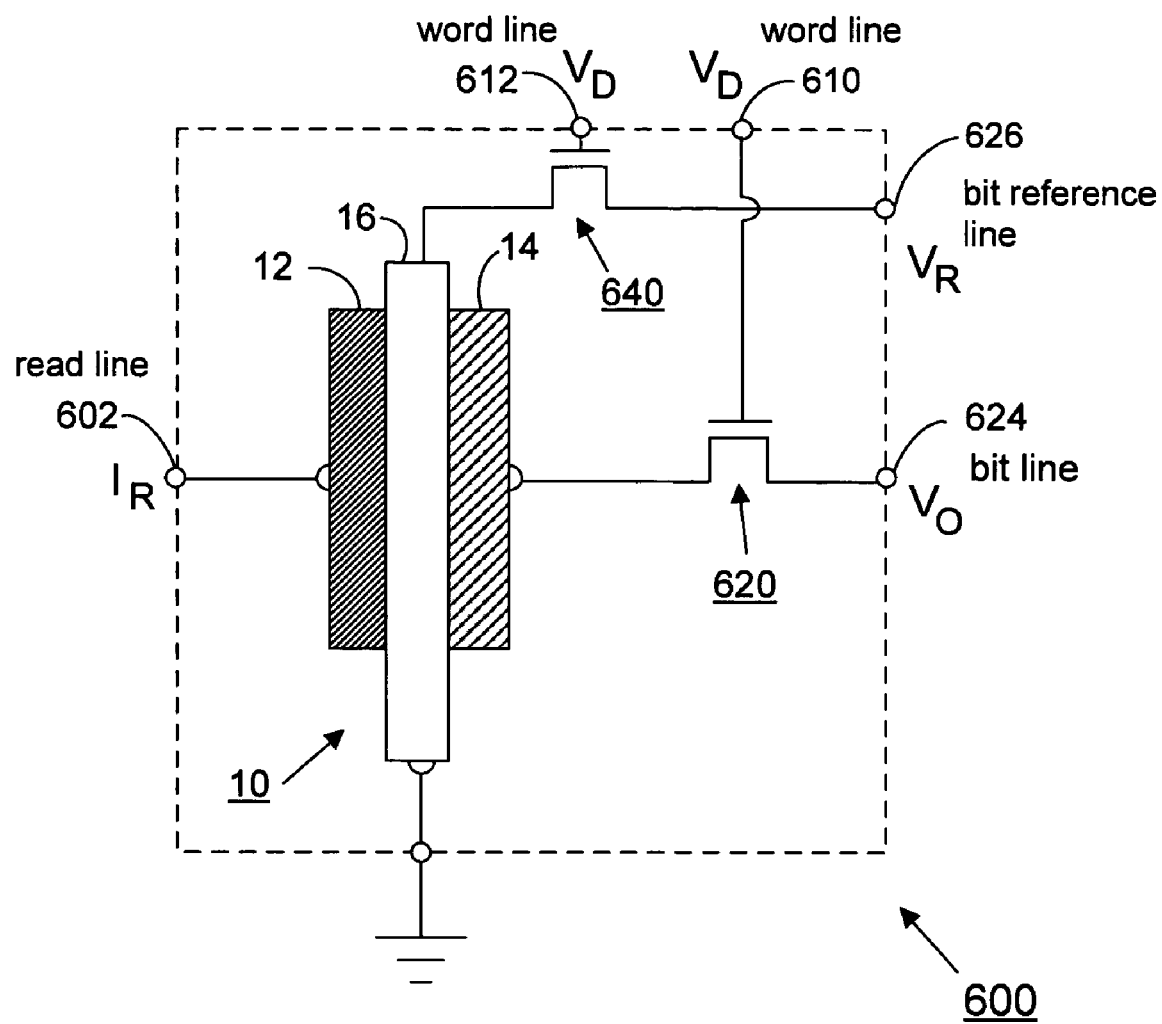
FIG. 6 is a schematic view of a third embodiment of a hybrid spin transistor memory cell comprised of a single magnetic spin transistor and two select transistors, where the reference voltage differs from that of FIG. 5.

Third Embodiment of Hybrid Memory Cell with Bipolar Output and Configurable Offset A third embodiment of a spin transistor hybrid memory cell 600, conceptually very similar to the second, is presented in FIG. 6. If the ground plane is not constant over a large area of the chip but the use of a bipolar sense circuit is still desired, this third embodiment can be used. Here the reference voltage $V_R$ is taken from the base, at a location of the base that is remote from the base-collector interface and which is independent of the base resistance $R_B$. This figure demonstrates that a variation of sample geometry, as well as selection of an appropriate value for $R_B$, can be used to configure the offset voltage of the spin transistor. In the configuration schematically in FIG. 6, the offset [relative to the reference] is zero regardless of the value of $R_B$, and the output voltage, with respect to this reference, is symmetrically bipolar. As before, a select transistor 620 isolates the collector 14 from the bit line and a second select transistor 640 isolates the base from the bit reference line. The bit and bit reference lines are common lines for the array and are connected to a sense amplifier. The read operation proceeds in a manner that is similar to that described above. A current pulse [typically 1–10 mA], applied through the read [or bias] line, and a voltage pulse [typically on the order of 1–5 V], applied through the word line, are simultaneously applied to the input terminal 602 of the spin transistor and the select terminals 610 and 612 of the two select transistors. The source-drain resistance of each transistors now low and the output voltage $V_O$ developed at the collector 14 of the spin transistor and the reference voltage $V_R$ from the base 16 of the spin transistor are available at the output terminal 624 and reference terminal 626. A bit line and a bit reference line, common to the elements in a column of the array, transmit $V_O$ and $V_R$ respectively, to a high input impedance sense amplifier [or preamplifier] at the end of the line.

Hybrid Memory Cell Array

Figure 7:
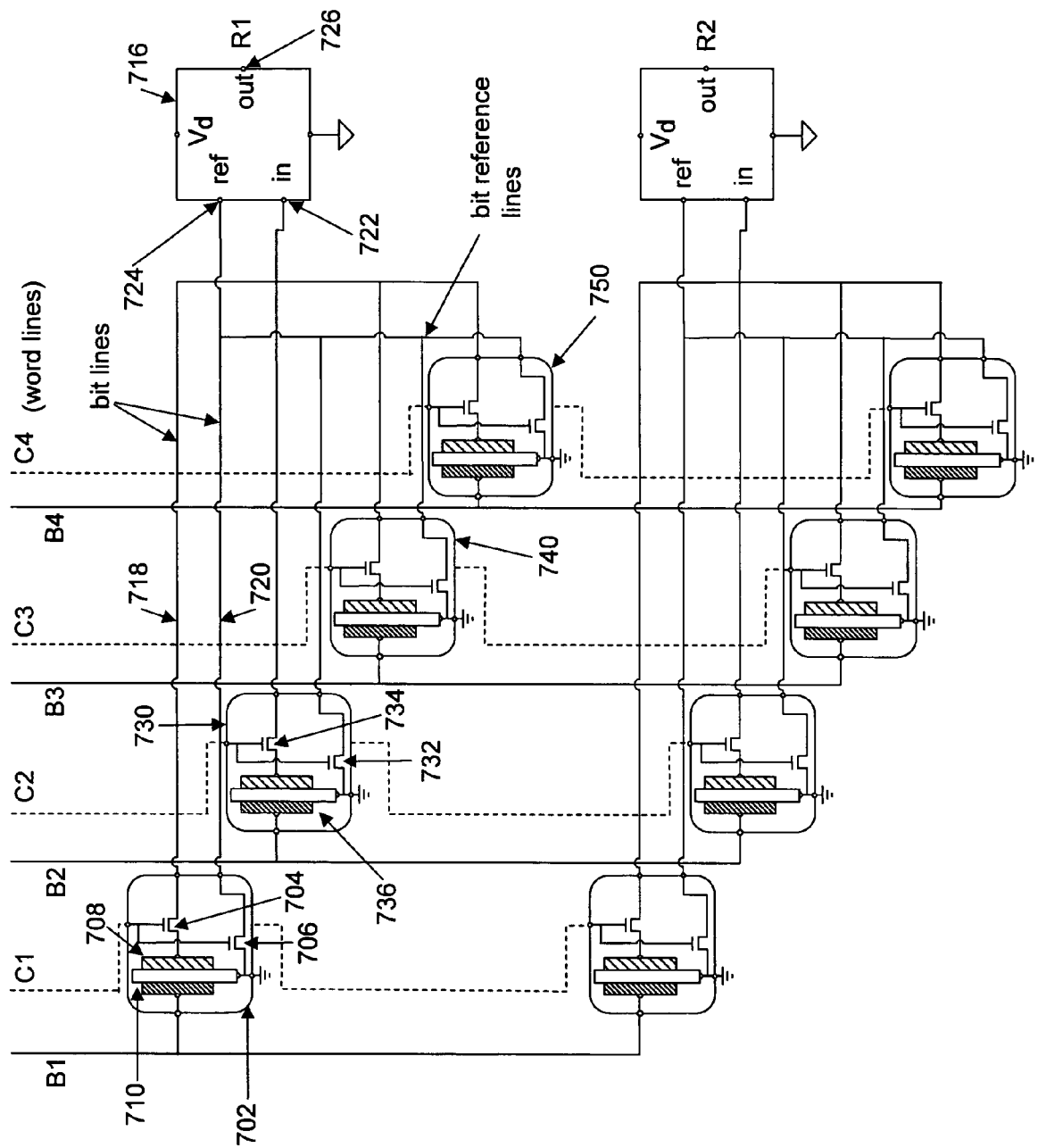
FIG. 7 is a random access memory circuit schematic depicting the use of hybrid cells including magnetic spin transistor and FETs in a memory array.

The integration of a magnetic spin transistor hybrid memory cell as each element in a random access array of elements is depicted schematically in FIG. 7 for the example of a 2×4 cell array. This example uses the second embodiment of a hybrid magnetic spin transistor, depicted in detail in FIG. 5, but it is understood that a similar diagram could be drawn with any of the embodiments forming the contents of the cell, with appropriate adjustments made for the sense amplifiers and bit lines. To read the contents of cell (C1, R1) 702, for example, a voltage is applied to the word line C1 to select all to the "on" state and the paths from the collector 708 and base 710 of cell 702 to the sense amplifier 716 are now conductive. A bias current applied to read (bias) line B1 develops a voltage at the collector 708 relative to the base 710, and the voltage is transmitted down bit line 718 and bit reference line 720 to the input 722 and reference 724 terminals of the sense circuit. The voltage is amplified and is made available at the output terminal 726. The sense circuit may be the sole amplifier on the line, providing, for example, a TTL or CMOS compatible voltage at the output 726, or it may be a preamplifier that is associated with a block of cells and transmits a voltage to a line R1 that is common to other blocks of cells and that delivers the voltage to a secondary sense circuit at the end of line R1. All cells in column C1 are read during this process. The contents of the particular cell 702 are identified by addressing the output 726 of the sense circuit of row R1.

Because the bit and bit reference lines are common to all cells 702, 730, 740, and 750 in row R1, the importance of the isolation transistors is readily apparent. If, for example, the isolation transistors 732 and 734 in cell 730 were absent, a high conducting path [through the low impedance spin transistor 736] would connect the bit and bit reference line and the readout voltage from cell 702 would be destroyed by the short circuit.

In the schematic drawing of FIG. 7 the cells on each read line are connected in parallel. Each spin transistor has an electrical impedance of order 1 ohm and it is understood that the resistance of the bias line is small compared to that of each spin transistor. It is also understood that the cells could equally well be connected in series. In any case, the read line can be matched to a standard 50 Ω source and the power dissipated during the read cycle [using about 1 mA for a bias current] is of order 50 microwatts. The power per cell is minimal, and local heating of the cell is minimal. The diagram of FIG. 7 has been drawn for circuits operating with a bipolar power supply, typically −5 to +5 volts. It is often desired to operate a circuit with a single power supply, e.g. 0 to +V volts. It will be clear to persons skilled in the art that the circuit of FIG. 7 functions in the same manner when ground is biased up to 2.5 V using standard techniques. Then "ground" has the usual meaning, as the midpoint of the circuit, but is really at (e.g.) 2.5 V rather than 0 V.

The discussion above has been based on the use of FETs as part of the hybrid cell, but in principle other isolating (select) elements should also work equally effective. For example, bipolar junction transistors, thin film transistors, etc., should work in the same manner.

It's also possible to fabricate multiple layers of spin transistors on a chip, in a stack arrangement. A first array of cells could be made using the method described above, followed by a planarization layer (e.g., such as polyimide). The polyimide layer passivates and acts as an insulator. Then additional layers of spin transistors could be formed above this first layer, device etc. In this way density would be increased by a factor of n where n is the number of layers in the stack.

One problem with this type of stack arrangements is that the isolation transistor can be readily fabricated only on the first layer, i.e. on the surface of the Si substrate. However, other kinds of select devices, such as a thin film FETs, amorphous silicon FETs, etc. could also be formed in intermediate layers to form alternating layers of select transistors and magnetic spin transistor storage elements.

Alternatively, if a single select FET is fabricated on the substrate, several spin transistors, in a stack, could be connected to the one select FET on the bottom (on the Si surface), thus allowing all of the spin transistor states to be read out at once. For example, if the stack had 8 bits, then it is possible to address and read out a byte at a time. One scheme for reading out several bits at a time in this manner would involve giving each magnetic spin transistor in a given layer a transimpedance unique to that layer so that the output voltage could be deconvolved into the bits for the cell of each layer.

Although the present invention has been described in terms of a preferred embodiment, it will be apparent to those skilled in the art that many alterations and modifications may be made to such embodiments without departing from the teachings of the present invention. For example, it is apparent that other types of memory cell elements beyond those illustrated in the foregoing detailed description can be formed using the teachings of the present invention. Accordingly, it is intended that the all such alterations and modifications be included within the scope and spirit of the invention as defined by the following claims.

The invention claimed is:

1. A method of operating a multi-bit magnetoelectronic memory device comprising:
   providing a stacked arrangement of separate magnetic spin based memory elements over a semiconductor substrate;
   wherein each of said magnetic spin based memory elements stores at least one bit of data in the form of an electron spin state associated with a ferromagnetic layer, so that a plurality of separate data bits can be stored in said stacked arrangement of separate magnetic memory elements in the form of a plurality of separate electron spin states;
   addressing and reading said stacked arrangement of separate magnetic spin based memory elements so that said plurality of separate electron spin states can be read out at the same time.

2. The method of claim 1, wherein each magnetic spin based memory element is a three terminal magnetic spin transistor.

3. The method of claim 1, further including a step: coupling at least one semiconductor isolation element to said stacked arrangement of separate magnetic spin based memory elements.

4. The method of claim 3, wherein said semiconductor isolation element is a field effect transistor.

5. The method of claim 1, wherein an entire byte worth of data can be read at once from said stack arrangement of magnetic spin based memory elements.

6. The method of claim 1, including a step of providing a separate layer for each magnetic spin based memory element in said stacked arrangement.

7. A method of providing a multi-layer magnetoelectronic memory device comprising:
   providing a plurality of separate ferromagnetic layers in a stacked arrangement situated on a silicon based substrate;
   wherein each of said plurality of separate ferromagnetic layers stores at least one bit of data in the form of an electron spin state, so that a plurality of data bits can be stored in said stacked arrangement;
   providing at least one low transmission barrier layer in said stacked arrangement;
   reading all of said plurality of data bits at the same time.

8. The method of claim 7, wherein each magnetic spin based memory element is a three terminal magnetic spin transistor.

9. The method of claim 7, further including a first semiconductor isolation element which isolates said stacked arrangement.

10. The method of claim 7, further including a step: providing a plurality of second separate ferromagnetic layers, each of which is coupled to an associated one of said plurality of separate ferromagnetic layers, such that said one bit of data is related to a relative magnetization state of a pair of one of said plurality of separate ferromagnetic layers and one of said second separate ferromagnetic layers.

11. The method of claim 7, further including a plurality of thin film semiconductor isolation elements situated in layers between said plurality of magnetic spin based memory elements.

12. The method of claim 7, wherein said separate ferromagnetic layers are separated by insulating layers.

13. A method of operating a multi-layer magnetoelectronic memory device comprising:
   providing a plurality of separate magnetic spin based memory elements situated in a stacked arrangement on a semiconductor substrate;
   wherein said each of said plurality of separate magnetic spin based memory elements includes a plurality of separate corresponding storage layers;
   providing a plurality of separate insulating layers interposed between said separate corresponding storage layers for insulating said separate magnetic spin based memory elements;
   wherein each magnetic spin based memory element stores a bit of data in the form of an electron spin state associated with a ferromagnetic layer, so that a plurality of data bits can be stored in said magnetic memory elements in the form of a plurality of separate electron spin states;
   further wherein each magnetic spin based memory element includes a unique transimpedance compared to other magnetic spin based memory elements in said stack arrangement;
   reading all of said plurality of separate magnetic spin based memory elements at the same time in said stacked arrangement.

14. The method of claim 13, wherein multiple data bits can be read out at the same time by deconvolving an output voltage of the magnetoelectronic memory device to determine a value of individual bits for each magnetic spin based memory element.

15. The method of claim 13, wherein each of said plurality of magnetic spin based memory elements includes a magnetic spin transistor with an associated ferromagnetic collector, ferromagnetic emitter, and base.

16. The method of claim 13, further providing a semiconductor isolation element to isolate an output of such device.

17. The method of claim 13, wherein said semiconductor isolation element is a field effect transistor.

18. The method of claim 17, wherein each of said plurality of magnetic spin based memory elements includes a low transmission barrier.

19. The method of claim 17, wherein said field effect transistor is situated in a thin film layer.

20. The method of claim 13, wherein said unique transimpedance is set by configuring a base material associated with each of said magnetic spin based memory elements.

* * * * *